United States Patent
Yang et al.

(10) Patent No.: US 6,768,190 B2
(45) Date of Patent: Jul. 27, 2004

(54) STACK TYPE FLIP-CHIP PACKAGE

(75) Inventors: Chaur-Chin Yang, Tainan (TW); Hsueh-Te Wang, Kaohsiung (TW)

(73) Assignee: Advanced Semiconductor Engineering, Inc., Kaohsiung (TW)

( * ) Notice: Subject to any disclaimer, the term of this patent is extended or adjusted under 35 U.S.C. 154(b) by 0 days.

(21) Appl. No.: 10/128,719

(22) Filed: Apr. 23, 2002

(65) Prior Publication Data

US 2003/0141582 A1 Jul. 31, 2003

(30) Foreign Application Priority Data

Jan. 25, 2002 (TW) ........................................ 91101229 A

(51) Int. Cl.⁷ .......................... H01L 23/02; H01L 23/48
(52) U.S. Cl. ...................... 257/686; 257/778; 257/777; 257/685; 257/723
(58) Field of Search ................................ 257/723, 685, 257/686, 777, 778, 773, 784, 690, 691, 737, 738, 676, 779, 684, 787

(56) References Cited

U.S. PATENT DOCUMENTS 5,994,166 A * 11/1999 Akram et al.
6,404,062 B1 * 6/2002 Taniguchi et al.
6,563,206 B2 * 5/2003 Kamikuri et al.
6,577,008 B2 * 6/2003 Lam et al.

\* cited by examiner

Primary Examiner—Long Pham
Assistant Examiner—DiLinh Nguyen
(74) Attorney, Agent, or Firm—J.C. Patent

(57) ABSTRACT

A stack type flip-chip package that utilizes a redistribution circuit on the back of a chip to serve as a bridge for connecting with other chips. The package includes at least a substrate, a first chip, a second chip, some underfill material and some packaging material. The substrate has a plurality of bump contacts and a plurality of line contacts thereon. The first chip has an active surface with a plurality of first bonding pads thereon. The back surface of the first chip has a redistribution circuit. The redistribution circuit has a plurality of bump pads and a plurality of line pads thereon. The second chip has an active surface with a plurality of second bonding pads thereon. Bumps are positioned between the bump contacts and the first bonding pads and between the bump pads and the second bonding pads. Conductive wires connect the line contacts and the line pads. The underfill material fills the space between the chip and the substrate and the gap between the first and the second chips. The packaging material encloses the chips and the conductive wires.

3 Claims, 3 Drawing Sheets

STACK TYPE FLIP-CHIP PACKAGE

CROSS-REFERENCE TO RELATED APPLICATION

This application claims the priority benefit of Taiwan application serial no. 91101229, filed Jan. 25, 2002.

BACKGROUND OF THE INVENTION

1. Field of Invention

The present invention relates to a stack type flip-chip package. More particularly, the present invention relates to a stack type flip-chip package having redistribution lines on the back of chips to serve as bridges.

2. Description of Related Art

To form a flip-chip package, a silicon chip having an active surface with an array of bonding pads thereon is provided. Bumps are formed on each bonding pad so that the chip may flip over and attach to the contact points on a package carrier. In general, a flip-chip package occupies a small area and has a high packaging density. Moreover, direct electrical connection through bumps reduces signal transmission path. Therefore, flip-chip designs are employed in chip scale packages (CSP), ball grid array (BGA) packages and multi-chip module (MCM). Note that a number of chips each having a different function is enclosed within a single package for a multi-chip module. Hence, multi-chip module not only reduces packaging volume and area, but also shortens transmission path between chips. Ultimately, overall performance is improved.

To form a conventional multi-chip package, both flip-chip technique and chip stacking designs are employed so that two or more chips each having a different function are enclosed within a single package. As before, the advantages of combining flip-chip technique with a stacking design not only reduces packaging area and increases packing density, but also shortens signal transmission length and improves performance.

FIG. 1 is a schematic cross-sectional view of a conventional stack type flip-chip package. As shown in FIG. 1, the stack type flip-chip package 10 uses both the flip-chip technique and a stacking design such that an upper chip 14 and a lower chip 16 are packaged inside a substrate 12. The upper chip 14 has a redistribution line 18. The redistribution line 18 not only provides a bonding pad 20 for connecting with a contact pad 24 on the substrate 10 through a bump 22, but also provides another bonding pad 26 for connecting with a bump 28 on the lower chip 16. In addition, the bonding pad 26 also fans out to yet another bonding pad 30. The bonding pad 30 connects with a contact pad 34 on the substrate 12 through a bump 32 so that the lower chip 16 and the substrate 12 are electrically connected. To accommodate the lower chip 16, the substrate 12 has an opening (or cavity). The package also requires the injection of some underfilling material 38. The underfilling material 38 fills up the space between the substrate 12, the upper chip 14 and the lower chip 16 and protects the bumps, bonding pads and contact pads against shock and vibrations.

The aforementioned stack type flip-chip package design has the following drawbacks. The upper chip must provide sufficient number of bonding pads for connecting with the bumps on the lower chip. Hence, useful area on the upper chip is greatly reduced and bonding pad arrangement on the upper chip is severely limited. Moreover, the gaps between the substrate and the upper and lower chip on one hand and between the upper and lower chip on the other hand are small and unevenly distributed. Thus, filling up all the space within the package with underfill material is difficult.

SUMMARY OF THE INVENTION

Accordingly, one object of the present invention is to provide a multi-chip module having a stack type flip-chip design for accommodating two or more chips each having a different function inside a single package, thereby reducing overall production cost.

To achieve these and other advantages and in accordance with the purpose of the invention, as embodied and broadly described herein, the invention provides a stack type flip-chip package. The package includes a substrate, a first chip, a second chip, some underfill material and some packaging material. One surface of the substrate has a plurality of bump contacts and a plurality of line contacts thereon. The first chip has an active surface with a plurality of first bonding pads thereon. The package further includes a redistribution circuit on the backside surface of the first chip. The redistribution circuit has a plurality of bump pads and a plurality of line pads thereon. The second chip has an active surface with a plurality of second bonding pads thereon. Second bumps are positioned between the bump contacts and the first bonding pads and between the bump pads and the second bonding pads. A plurality of conductive wires connects the line contacts and the line pads. The underfill material fills up the space between the first chip and the substrate and the gap between the first chip and the second chip. The packaging material encloses the first chip, the second chip and all the conductive wires.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1:
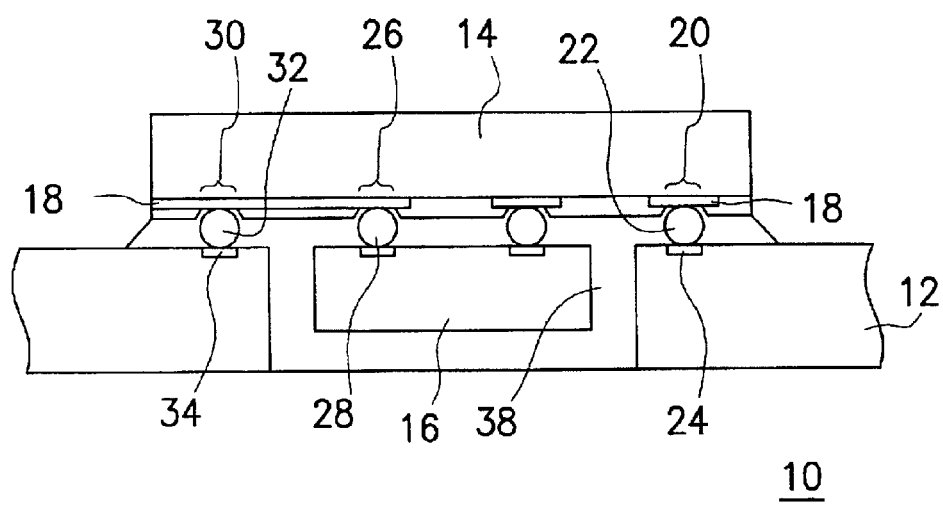
FIG. 1 is a schematic cross-sectional view of a conventional stack type flip-chip package.

Reference will now be made in detail to the present preferred embodiments of the invention, examples of which are illustrated in the accompanying drawings. Wherever possible, the same reference numbers are used in the drawings and the description to refer to the same or like parts.

Figure 2:
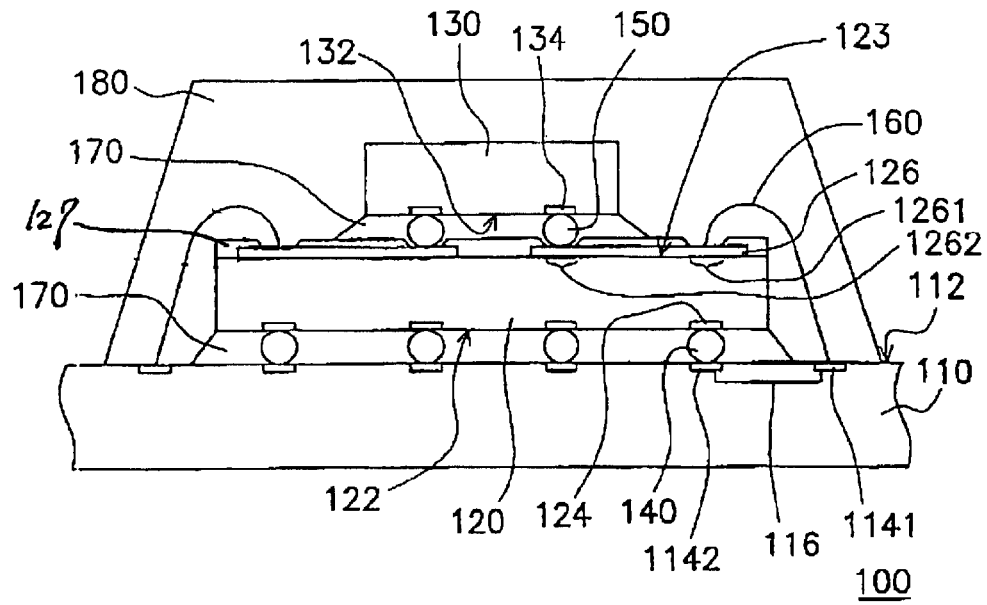
FIG. 2 is a schematic cross-sectional view of a stack type flip-chip package according to a first embodiment of this invention.

FIG. 2 is a schematic cross-sectional view of a stack type flip-chip package according to a first embodiment of this invention. As shown in FIG. 2, major elements of a stack type flip-chip package 100 include a substrate board 110, a first chip 120, a second chip 130, some underfill material 170 and some packaging material 180. The substrate 110 has a surface 112 with plurality of line contacts 1141 and a plurality of bump contacts 1142 thereon. The first chip 120 has an active surface 122 with a plurality of bump pads 124 thereon. A bump 140 such as a solder bump or a gold bump is attached to each bump pad 124 on the first chip 120. The active surface 122 of the first chip 120 faces the substrate surface 112 and the bumps 140 on the first chip 120 are attached to respective bump contacts 1142 of the substrate 110. Hence, the first chip 120 is above the substrate 110 but exposes a plurality of line contacts 1141 near the periphery of the substrate surface 112. The substrate 110 may be a printed circuit board (PCB) such as a high-density fine pitch PCB or a flip-chip board or carrier.

Figure 3:
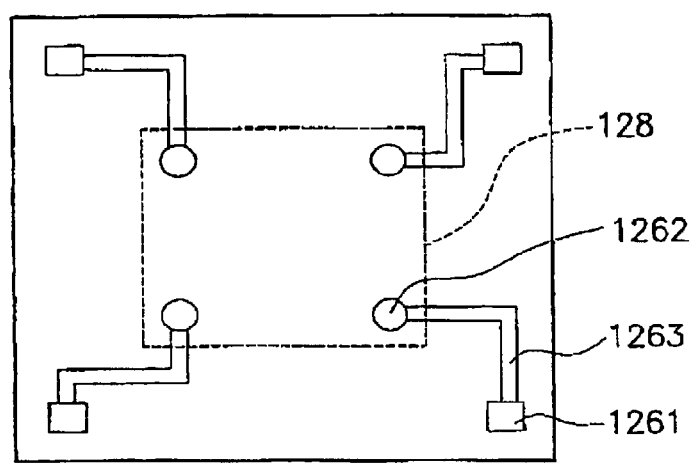
FIG. 3 is a top view of the first chip shown in FIG. 2.

The attachment of bump pads 134 on an active surface 132 of the second chip 130 onto a backside surface 123 of the first chip 120 using a flip-chip technique is shown in greater detail in FIG. 3. FIG. 3 is a top view of the first chip shown in FIG. 2. The back surface 123 of the first chip 120 has a patterned redistribution circuit 126 with line pads 1261 and bump pads 1262 thereon. A passivation layer 127 is further disposed covering the redistribution circuit 126 but exposing the line pads 1261 and the bump pads 1262, as shown in FIG. 2. Each bump pad 1262 fans out to a corresponding line pad 1261 through circuit lines 1263. The rectangular area enclosed by dash lines indicates a bump pad region 128. The second chip 130 is positioned over the back surface 123 of the first chip 120 within the bump pad region 128.

Bumps 150 are attached to the bump pads 134 on the second chip 130. Each bumps 150 are attached a corresponding bump pad 1262 along the redistribution circuit 126 so that the second chip 130 is electrically connected to the redistribution circuit 126 on the backside surface 123 of the first chip 120. By conducting a wire-bonding operation, one end of a conductive wire 160 is attached to the line pad 1261 while the other end of the conductive wire 160 is attached to the line contact 1141. Hence, the second chip 130 is electrically connected to the line contact 1141 on the substrate board 110 through the bump 150, the redistribution circuit 126 and the conductive wire 160. A circuit 116 formed within the substrate board 110 may also be used to connect the line contact 1141 with a bump contact 1142 so that the first chip 120 and the second chip 130 are electrically connected.

The underfill material 170 fills up the space between the first chip 120 and the substrate 110 and the gap between the first chip 120 and the second chip 130. The packaging material 180 encloses the first chip 120, the second chip 130 and the conductive wires 160 so that the bumps, contacts, bonding pads and the conductive wires are well protected within the package. If the first chip and the second chip have relatively small dimensions, the chips and conductive wires may be entirely enclosed by packaging material 180.

Figure 4:
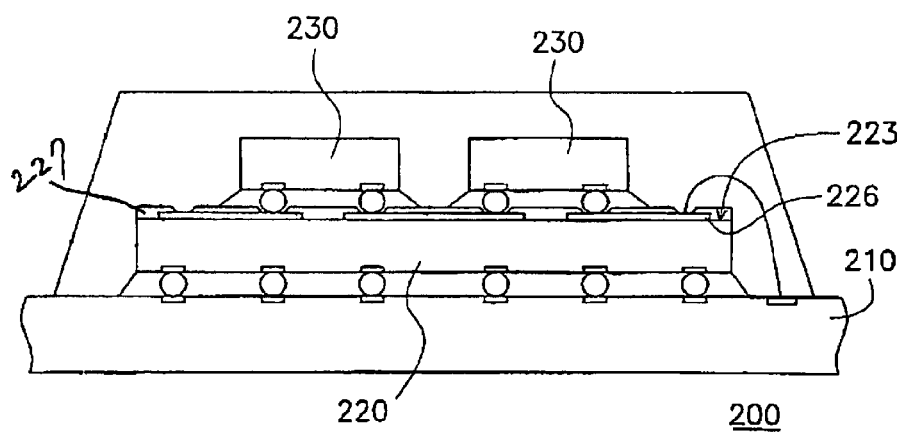
FIG. 4 is a schematic cross-sectional view of a stack type flip-chip package according to a second embodiment of this invention.

FIG. 4 is a schematic cross-sectional view of a stack type flip-chip package according to a second embodiment of this invention. One major difference from the first embodiment in FIG. 2 is that the stack type flip-chip package 300 in FIG. 4 has a plurality of second chips 230 on the back surface 223 of the first chip 220. Furthermore, different second chips 230 may be mutually connected through the redistribution circuit 226. A passivation layer 227 is further disposed covering the redistribution circuit 226 but exposing the line pads and the bump pads.

Figure 5:
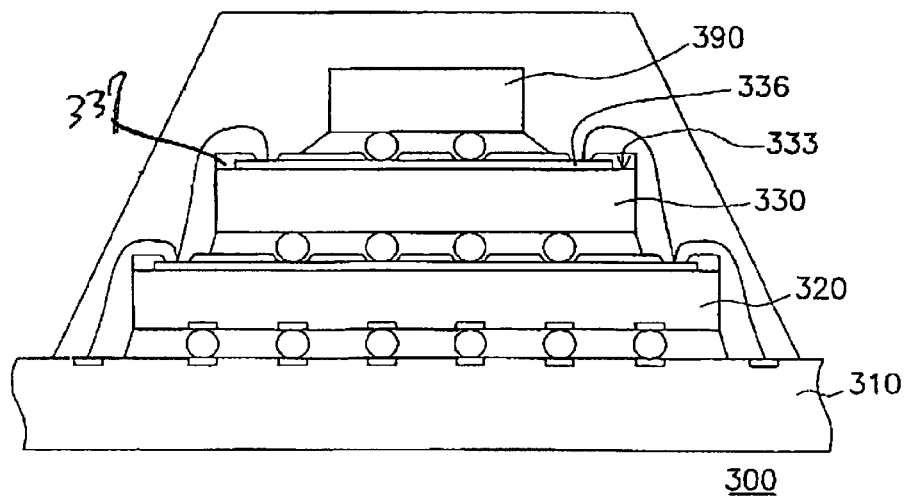
FIG. 5 is a schematic cross-sectional view of a stack type flip-chip package according to a third embodiment of this invention.

FIG. 5 is a schematic cross-sectional view of a stack type flip-chip package according to a third embodiment of this invention. One major difference from the first embodiment in FIG. 2 is that the stack type flip-chip package 300 in FIG. 5 has a redistribution circuit 336 at the back surface 333 of the second chip 330. A passivation layer 337 is further disposed covering the redistribution circuit 336 but exposing the line pads and the bump pads. Hence, a third chip 390 can be attached to the back surface 333 of the second chip 330 to form a three tiered structure. Note that the stack type flip-chip packages 200 and 300 as shown in FIGS. 4 and 5 can be combined to from a flip-chip package structure having different number of layers and different number of chips in each layer.

In conclusion, the stack type flip-chip package of this invention utilizes a redistribution circuit on the back surface of a flipped chip to serve as a bridge for connecting two or more chips each having a different function inside a single package. Wire bonding is employed to form necessary electrical connections between the redistribution circuit and contacts on the substrate board. Hence, an upper level chip may connect electrically with the substrate or a lower level chip through the redistribution circuit and the conductive wires or a pair of upper level chips may connect electrically with each other through the redistribution circuit.

In addition, the stack type flip-chip design may also be applied to other packages including a pin grid array (PGA), a ball grid array (BGA) package or a direct chip array (DGA) package. Therefore, the flip-chip design not only facilitates the stacking of chips and the formation of a package over a printed circuit board, but also provides an easy means of connecting up chips on the package with contacts on the printed circuit board.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A stack type flip-chip package, comprising:
   a substrate board having a surface with a plurality of bump contacts and a plurally of line contacts thereon;
   a first chip having a first active surface and a back surface, wherein the first active surface has a plurality of first bonding pads thereon;
   a redistribution circuit layer on the back surface of the first chip, wherein the redistribution circuit layer has a plurality of bump pads and a plurality of line pads thereon;
   a passivation layer on the back surface of the first chip, exposing the bump pads and the line pads of the redistribution circuit layer;
   a second chip having a second active surface with a plurality of second bonding pads thereon;
   a plurality of bumps, wherein a portion of the bumps are disposed between the bump contacts and the first bonding pads, and a portion of the bumps are disposed between the bump pads and the second bonding pads;
   a plurality of conductive wires for connecting between the line contacts and the line pads;
   a packaging material, used for enclosing the first chip, the second chip and the conductive wires; and
   an underfill material filling the space between the first chip and the substrate and filling the gap between the first chip and the second chip.

2. A stack type flip-chip package, comprising:
a substrate having a surface with a plurality of bump contacts and a plurality of line contacts thereon;
a first chip having a first active surface and a back surface, wherein the first active surface has a plurality of first bonding pads thereon;
a redistribution circuit layer on the back surface of the first chip, wherein tho redistribution circuit layer has a plurality of bump pads and a plurality of line pads thereon;
a passivation layer on the back surface of the first chip, exposing the bump pads and the line pads of the redistribution circuit layer;
a plurality of second chips each having a second active surface with a plurality of second bonding pads thereon;
a plurality of bumps, wherein a portion of the bumps are disposed between the bump contacts and the first bonding pads and a portion of the bumps are disposed between the bump pads and the second bonding pads;
a plurality of conductive wires for connecting between the line contacts and the line pads;
a packaging material for enclosing the first chip, the second chips and the conductive wires; and
an underfill material filling the space between the first chip and the substrate and filling the gaps between the first chip and the second chips.

3. A stack type flip-chip package, comprising:
a substrate having a surface with a plurality of bump contacts and a plurality of line contacts thereon;
a first chip having a first active surface and a back surface, wherein the first active surface has a plurality of first bonding pads thereon;
a first redistribution circuit layer on the back surface of the first chip, wherein the redistribution circuit layer has a plurality of first bump pads and a plurality of first line pads thereon;
a first passivation layer on the back surface of the first chip, exposing the first bump pads and the first line pads of the first redistribution circuit layer;
a plurality of second chips each having a second active surface with a plurality of second bonding pads thereon;
a plurality of second redistribution circuit layers on the back surfaces of the second chips, wherein each second redistribution circuit layer has a plurality of second bump pads and a plurality of second line pads thereon;
a plurality of second passivation layers on the back surfaces of the second chips, exposing the second bump pads and the second line pads of the second redistribution circuit layers;
at least one third chip having a third active surface with a plurality of third bonding pads thereon;
a plurality of bumps disposed between the bump contacts and the first bonding pads, disposed between the second bonding pads and the first bump pads, and disposed between the second bump pads and the third bonding pads;
a plurality of conductive wires for connecting between the line contacts and the first line pads, and connecting between the second line pads and the first line pads;
a packaging material for enclosing the first chip, the second chips, the third chip and the conductive wires; and
an underfill material filling the space between the first chip and the substrate, filling the gap between the first chip and the second chip, and filling the gap between the second chip and the third chip.

* * * * *